United States Patent
Tanaka et al.

(10) Patent No.: US 7,459,217 B2
(45) Date of Patent: Dec. 2, 2008

(54) FLAME RETARDANT POLYESTER FILM AND PROCESSED PRODUCT INCLUDING THE SAME

(75) Inventors: Shotaro Tanaka, Shiga (JP); Tatsuro Tsuchimoto, Shiga (JP); Takashi Mimura, Shiga (JP); Junpei Ohashi, Shiga (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 10/755,954

(22) Filed: Jan. 13, 2004

(65) Prior Publication Data

US 2004/0161620 A1 Aug. 19, 2004

(30) Foreign Application Priority Data

Jan. 24, 2003 (JP) ............................. 2003-015780

(51) Int. Cl.
*B32B 27/36* (2006.01)
(52) U.S. Cl. ..................................... 428/473.5; 428/480
(58) Field of Classification Search .............. 428/473.5, 428/474.4, 475.2, 480; 528/350
See application file for complete search history.

(56) References Cited

U.S. PATENT DOCUMENTS

| | | | |
|---|---|---|---|
| 4,681,928 A | | 7/1987 | Berger et al. |
| 5,358,786 A | * | 10/1994 | Ishikawa et al. ............ 428/380 |
| 6,455,136 B1 | | 9/2002 | Okajima et al. |
| 6,743,841 B2 | * | 6/2004 | Shimizu et al. ............. 524/136 |
| 2004/0013892 A1 | | 1/2004 | Shinji et al. |

FOREIGN PATENT DOCUMENTS

| | | | |
|---|---|---|---|
| EP | 0 992 557 | | 4/2000 |
| JP | 63 165138 | | 7/1988 |
| JP | 02-007315 | | 1/1990 |
| JP | 02-008278 | | 1/1990 |
| JP | 07310011 A | * | 11/1995 |
| JP | 10-278206 | | 10/1998 |
| JP | 2000-280427 | * | 10/2000 |
| JP | 2001-3222217 A | * | 11/2001 |
| JP | 2002-172747 | | 6/2002 |
| WO | 96/17013 | | 6/1996 |

* cited by examiner

*Primary Examiner*—Thao T. Tran
(74) *Attorney, Agent, or Firm*—DLA Piper LLP

(57) ABSTRACT

The present invention is a flame-retardant polyester film including resin layers laminated on both surfaces of a polyester film, wherein the resin layer satisfies $15 \leq (Wc_1 - Wc_2)/Wc_0 \times 100 \leq 99$ (where $Wc_0$ represents the weight of the resin layer, $Wc_1$ represents the weight of the resin layer after the temperature thereof is raised from 25° C. to 600° C. in air, and $Wc_2$ represents the weight of the resin layer after the temperature thereof is raised from 25° C. to 800° C. in air), and has a non-flammable gas generating rate of 3 to 40 percent over the range of 180° C. to 450° C. The present invention provides a flame-retardant polyester film having an excellent flame retardancy, and adhesive tapes, flexible printed circuits, a membrane switch, a film heater, and a flat cable, each including the flame-retardant polyester film.

9 Claims, No Drawings

FLAME RETARDANT POLYESTER FILM AND PROCESSED PRODUCT INCLUDING THE SAME

BACKGROUND

1. Technical Field

This disclosure relates to a flame-retardant polyester film having an excellent flame retardancy and processed products including the same.

2. Description of the Related Art

Polyester films are used as magnetic recording materials, electrical insulation materials, capacitor materials, packaging materials, and building materials because of their mechanical characteristics, electrical characteristics, and the like. Furthermore, polyester films are used as various industrial materials for photographic applications, graphic applications, thermal transfer applications, and the like. However, there are problems in that polyester films are softened or melt by heat, and are flammable. In particular, when polyester films are used as electrical insulation materials for applications related to adhesive tapes, flexible printed circuits, membrane switches, film heaters, or flat cables, or are used as building materials, since there is a danger that a fire breaks out, requirements for further improvement in the flame retardancy of polyester films have become intensified.

With respect to technologies for improving the flame retardancy of polyester film, a method in which a bromine-based, phosphorous-based, inorganic, or other flame retardant is incorporated into a polyester film or a method in which a halogen-containing component or a phosphorous-containing component is subjected to copolymerization has been proposed (for example, Japanese Unexamined Patent Application. Publication No. 10-278206).

However in that invention, there are problems in that, for example, repeated exposure to flame causes enlargement of burning and, therefore, the flame retardancy is inadequate. With respect to these technologies, since the flame retardant is added to the polyester film, or the halogen—containing component or the phosphorous-containing component is included in the polyester by copolymerization, the mechanical characteristics inherent in the polyester film are degraded. In addition, the halogen compounds may adversely affect the environment. For example, it is feared that dioxins and the like are generated from the halogen compounds depending on the burning conditions. Furthermore, there is a problem in that generated gases may cause contamination in the process.

Another method has been proposed, in which a resin, e.g., polyamic acid, is laminated on a polyester film and, thereby, heat resistance and flame retardancy are imparted (for example, Japanese Unexamined Patent Application Publication No. 2002-172747).

In that invention, there is a problem in that repeated exposure to flame causes enlargement of burning.

With respect to the technology for improving the flame retardancy of adhesive tapes or membrane switches prepared by processing polyester films, a method has been proposed, in which a flame retardant is added to a bonding agent layer provided between layers in a processed product.

In that invention, the amount of the flame retardant added to the bonding agent layer must be increased in order to attain adequate flame retardancy. Consequently, when these processed product are further processed for end uses, there are problems in that, for example, the contaminations in the process occur due to seepage and the like of the flame retardant, and the discoloration of the processed product occur due to decomposition of the flame retardant during a heat treatment.

Likewise, with respect to the flexible printed circuits, the film heaters, and the flat cables prepared by processing the polyester films, a method is known, in which a flame retardant, e.g., a halogen compound, is added to a bonding-agent layer or an adhesive layer provided between layers in a processed product, but there are problems of, for example, seepage of the flame retardant added to the bonding-agent layer or the adhesive layer during processing because the amount of addition must be increased and the like.

It would therefore be advantageous to provide a flame-retardant polyester film having an excellent flame retardancy, and adhesive tapes, flexible printed circuits, a membrane switch, a film heater, and a flat cable, each including the flame-retardant polyester film.

SUMMARY

The flame-retardant polyester film includes resin layers laminated on both surfaces of a polyester film, wherein the resin layer satisfies the following Formula (1), and has a non-flammable gas generating rate of 3 to 40 percent over the range of 180° C. to 450° C.:

$$15 \leq (W_{c_1} W_{c_2})/W_{c_0} \times 100 \leq 99 \quad (1)$$

(where $W_0$ represents the weight of the resin layer at 25° C. in air, $W_{c1}$ represents the weight of the resin layer after the temperature thereof is raised from 25° C. to 600° C. in air, and $W_{c2}$ represents the weight of the resin layer after the temperature thereof is raised from 25° C. to 800° C. in air).

DETAILED DESCRIPTION

Resin layers satisfying the following Formula (1) and having a non-flammable gas generation rate of 3 to 40 percent over the range of 180° C. to 450° C. must be laminated on both surfaces of a polyester film:

$$15 \leq (W_{c_1} - W_{c_2})/W_{c_0} \times 100 \leq 99 \quad (1)$$

wherein $Wc_0$ represents the weight of the resin layer at 25° C. in air, $Wc_1$ represents the weight of the resin layer after the temperature thereof is raised from 25° C. to 600° C. in air, and Wc2 represents the weight of the resin layer after the temperature thereof is raised from 25° C. to 800° C. in air. According to this configuration, the flame retardancy of the polyester film can be achieved.

The resin layers must be laminated on both surfaces of the polyester film. When laminated simply on one surface, undesirably, the flame-retardant effect is not adequately exerted.

The method for determining $Wc_0$, $Wc_1$, and $Wc_2$ in the above-described Formula (1) is not specifically limited, and examples of methods include a method in which a thermogravimeter is used. That is, the weight of the resin layer is measured with the thermogravimeter in an atmosphere in which air is flowed at 50 ml/min. The weight of the resin layer at 25° C. in air before a heat treatment is represented by $Wc_0$. The temperature of the resin layer is raised at 10° C./min from 25° C., and the weight at the time when the temperature reaches 600° C. is represented by $Wc_1$. Furthermore, the temperature of the resin layer is continuously raised at. 10° C./min, and the weight at the time when the temperature reaches 800° C. is represented by $Wc_2$.

Although the detailed mechanism of exertion of the flame-retardant effect in the case where the above-described Formula (1) is satisfied is not clear, the mechanism is estimated as described below. When a resin layer satisfying the above-described Formula (1) is laminated, it is estimated that the resin layer remains as a flame-retardant carbonized layer in the case where the film is burned, and that this remaining flame-retardant carbonized layer covers the entire film and, thereby, the fire is promptly extinguished.

If the value of the above-described Formula (1) is less than 15, the flame-retardant effect is not adequately exerted. If the value exceeds 99, the amount of generation of non-flammable gases becomes inadequate and, therefore, the flame-retardant effect is not adequately exerted. Preferably, the value of the above-described Formula (1) is 20 to 95 and, more preferably, is 30 to 90. In particular, 20 to 65 is preferable.

The resin layer of the present invention must have a non-flammable gas generating rate of 3 to 40 percent over the range of 180° C. to 450° C. The non-flammable gas generating rate in the present invention can be determined from the following Formula, wherein $Wg_0$ represents the weight of the resin layer, and $Wg_1$ represents the weight of the non-flammable gases generated in a specific temperature range among the gases generated when the temperature of the resin layer is raised at a constant rate.

$$Wg_1/Wg_0 \times 100 \text{ (percent)} \qquad (2)$$

Examples of methods for determining the non-flammable gas generating rate include a method in which thermogravimetry-mass spectrometry (TG-MS) is used. The temperature of a sample is raised from 25° C. at 10° C./min in an atmosphere in which a helium gas is flowed at 50 ml/min, the components of the generated gases and the amount of generation are analyzed by the use of the thermogravimetry-mass spectrometry (TG-MS) and, thereby, the generating rate of the non-flammable gas generated in a specific temperature range can be determined.

In order to carry out more accurate analysis, the thermogravimetry-mass spectrometry (TG-MS) and the thermogravimetry-gas chromatograph mass spectrometry (TG-GC/Ms) may be used in combination. The temperature of a sample is raised from 25° C. at 10° C./min in an atmosphere in which a helium gas is flowed at 30 ml/min, the change in the concentration, on a mass number basis, of the gas generated from the sample during the heating is traced as a function of temperature, simultaneously with the decrease in the weight, by the use of TG-MS. At the same time, a measurement is carried out by the use of TG-GC/MS. The sample is heated with the thermogravimeter (TG) under the same condition as that of TG-MS, and generated gases are trapped with an adsorbent. Subsequently, the resulting adsorbent including generated gases trapped is heated to 280° C. with a thermal desorption apparatus, regenerated gases are subjected to the gas chromatograph-mass spectrometry (GC/MS) and, thereby, types of the generated gas are identified. The decrease in the weight, the change in the concentration, on a mass number basis, of the generated gas, and the types of the generated gas are analyzed by the above-described manner and, thereby, the generating rate of the non-flammable gas generated in a specific temperature range can be determined.

Here, "non-flammable gas" refers to a gas selected from the group consisting of nitrogen, carbon dioxide, water, chlorine, bromine, hydrogen chloride, hydrogen bromide, nitrogen monoxide, nitrogen dioxide, and cyanic acid. Preferably, the non-flammable gas in the present invention is at least one selected from the group consisting of nitrogen, water, nitrogen monoxide, nitrogen dioxide, and cyanic acid. This is because when these gases are generated, the flame retardancy is particularly excellently exerted.

Although the detailed mechanism of exertion of the flame-retardant effect in the case where the non-flammable gas generating rate of the resin layer is 3 to 40 percent over the range of 180° C. to 450° C. is not clear, the mechanism is estimated as described below. The polyester film is thermally decomposed in a temperature range of 180° C. to 450° C. and, thereby, flammable gases are generated. When the non-flammable gas generating rate of the resin layer is 3 to 40 percent over the range of 180° C. to 450° C., it is estimated that the flammable gases generated due to thermal decomposition of the polyester film are diluted by the non-flammable gases generated from the resin layer and, thereby, burning is prevented.

Preferably, the non-flammable gas generating rate is 3 to 40 percent over the range of 250° C. to 450° C. and, more preferably, is 3 to 40 percent over the range of 300° C. to 450° C. If the amount of generation of the non-flammable gases is large in the range of less than 180° C., gases are generated during the heat treatment in the preparation of the flame-retardant film or during the heat treatment in the after-processing of the flame-retardant film and, thereby, problems of contamination in the process, blisters on the film surface, and the like may occur. If the non-flammable gases are generated at a temperature higher than 450° C., the flame retardancy of the polyester film is not excellently exerted. Preferably, the non-flammable gas generating rate in the above-described temperature range is 3 to 30 percent, more preferably, is 4 to 25 percent and, further preferably, is 4 to 20 percent. In particular, 9 to 20 percent is preferable. If the non-flammable gas generating rate is less than 3 percent or more than 40 percent, adequate flame retardancy is not exerted.

It is estimated that when the film is exposed to flame, the effect of diluting the flammable gases generated from the polyester film by the non-flammable gases generated from the resin layer of the film surface and the effect of covering the entire film with the resin layer remaining as a flame-retardant carbonized layer are combined and, thereby, high flame retardancy is exerted.

Preferably, the resin component to form the resin layer is a resin having high heat resistance. Examples of resins may include polyphenylene sulfide, aromatic polyamide, polyimide, polyamide-imide, polyether sulfone, polyether imide, polybenzimidazole, polybenzoxazole, polybenzthiazole, polysulfone, polyetheretherketone, liquid crystal polyester, phenol resin, polyphenylene oxide, polyallylate, and polycarbonate. Among them, a resin component selected from the group consisting of aromatic polyamide, polyimide, polyamide-imide, polyether sulfone, polyether imide, polybenzimidazole, and polyphenylene oxide is preferable. In particular, polyimide is most preferable from the viewpoint of flame retardancy. Preferably, the resin component of the resin layer in the present invention has no halogen group.

The polyimide used in the present invention is not specifically limited but, preferably, is a polymer having cyclic imide groups as a repeating unit. The main chain of polyimide may include structural units, for example, aromatic, aliphatic, alicyclic, alicyclic ester unit, and oxycarbonyl unit, besides cyclic imide, within the range of not impairing the effects of the present invention.

Preferably, this polyimide includes a structural unit represented by, for example, the following Formula:

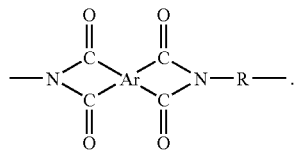

In the above-described Formula, Ar represents an aromatic group having 6 to 42 carbon atoms, R represents a divalent organic group selected from the group consisting of an aromatic group having 6 to 30 carbon atoms, an aliphatic group having 2 to 30 carbon atoms, and an alicyclic group having 4 to 30 carbon atoms.

In the above-described Formula, examples of Ar may include:

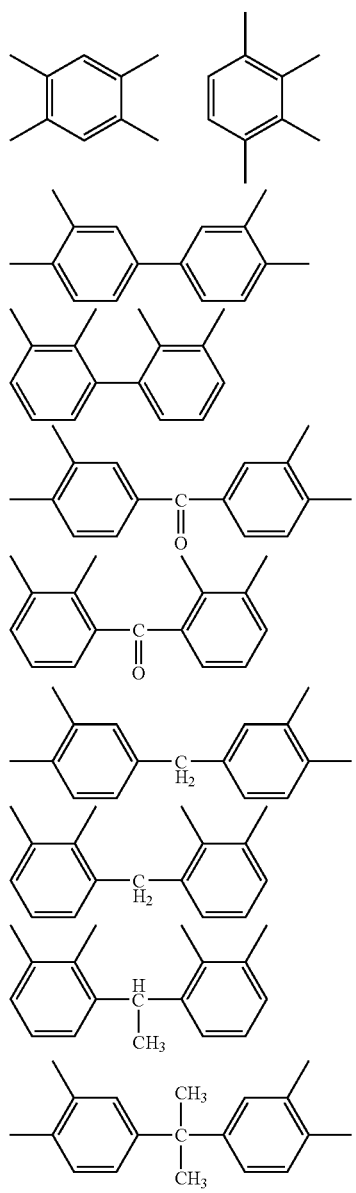
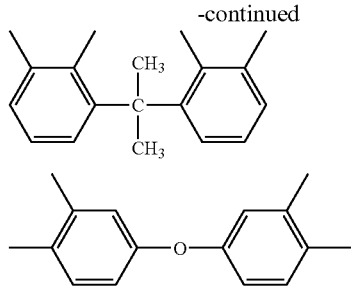
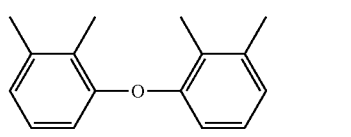
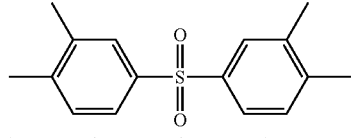
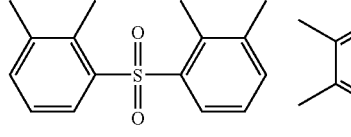
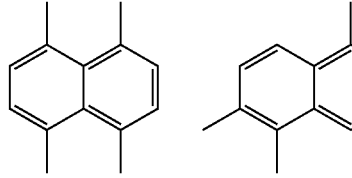

Examples of R may include:

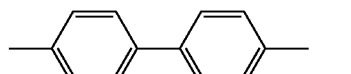
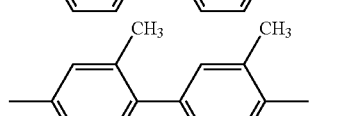
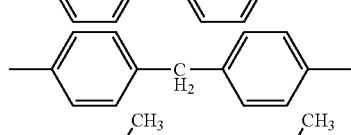
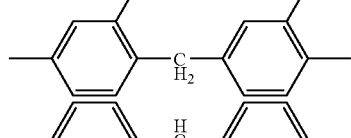
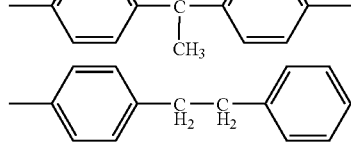
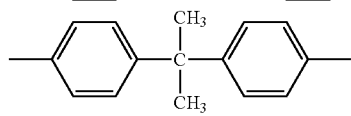

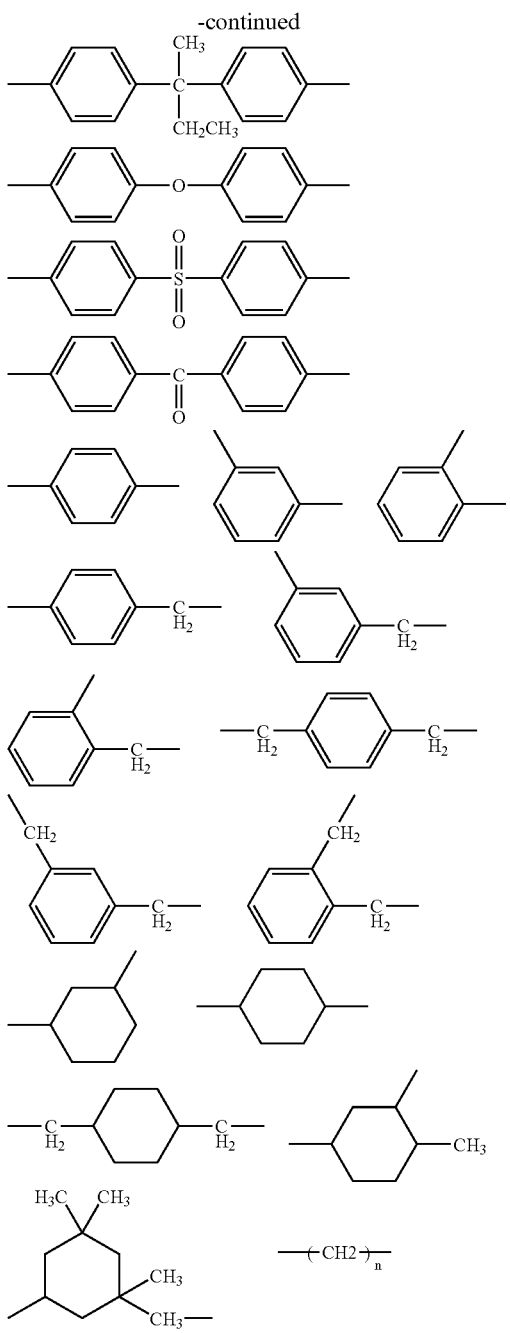

-continued

(In the Formula, n represents an integer of 2 to 30.)

These may be present alone or in combination in a polymer chain within the range of not hindering the effects.

This polyimide may be prepared by a known method. For example, tetracarboxylic acid, which is a raw material and from which the above-described Ar can be derived, and/or an acid anhydride thereof and at least one compound selected from the group consisting of aliphatic primary diamines and/or aromatic primary diamines, which is a raw material and from which the above-described R can be derived, are subjected to dehydration condensation, so that polyamic acid is prepared. Subsequently, the polyamic acid is subjected to cyclodehydration by the use of heating and/or a chemical cyclizing agent. Alternatively, a method in which tetracarboxylic anhydride and diisocyanate are heated and decarboxylated so as to be polymerized and the like may be exemplified.

Examples of tetracarboxylic acids used in the above-described methods include pyromellitic acid, 1,2,3,4-benzenetetracarboxylic acid, 3,3',4,4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, bis(3,4-dicarboxyphenyl)methane, bis(3,4-dicarboxyphenyl)methane, 1,1'-bis(2,3-dicarboxyphenyl) ethane, 2,2'-bis(3,4-dicarboxyphenyl)propane, 2,2$^1$-bis(2,3-dicarboxyphenyl)propane, bis(3,4-dicarboxyphenyl)ether, bis(2,3-dicarboxyphenyl)ether, bis(3,4-dicarboxyphenyl) sulfone, bis(2,3-dicarboxyphenyl)sulfone, 2,3,6,7-naphthalenetetracarboxylic acid, 1,4,5,8-naphthalenetetracarboxylic acid, 1,2,5,6-naphthalenetetracarboxylic acid, and 2,2'-bis [(2,3-dicarboxyphenoxy)phenyl]propane, and/or acid anhydrides thereof.

Examples of diamines include aromatic primary diamines, e.g., benzidine, diaminodiphenylmethane, diaminodiphenylethane, diaminodiphenylpropane, diaminodiphenylbutane, diaminodiphenylether, diaminodiphenylsulfone, diaminodiphenylbenzophenone, o,m,p-phenylenediamine, tolylenediamine, and xylenediamine; and aliphatic or alicyclic primary diamines, e.g., ethylenediamine, 1,2-propanediamine, 1,3-propanediamine, 2,2-dimethyl-1,3-propanediamine, 1,6-hexamethylenediamine, 1,8-octamethylenediamine, 1,9-nonamethylenediamine, 1,10-decamethylenediamine, 1,11-undecamethylenediamine, 1,12-dodecamethylenediamine, 2,2,4-trimethylhexamethylenediamine, 2,4,4-trimethylhexamethylenediamine, 1,3-cyclohexanediamine, 1,4-cyclohexanediamine, 1,4-cyclohexanedimethylamine, 2-methyl-1,3-cyclohexanediamine, and isophoronediamine.

In the method for manufacturing the above-described polyimide, when a method in which polyamic acid is prepared and, subsequently, cyclodehydration is carried out by the use of heating and/or a chemical cyclizing agent, the following dehydrators and catalysts are suitable for use.

Examples of dehydrators include aliphatic acid anhydrides, e.g., acetic anhydride, and aromatic acid anhydrides. Examples of catalysts include aliphatic tertiary amines, e.g., triethylamine; aromatic tertiary amines, e.g., dimethylaniline; and heterocyclic tertiary amines, e.g., pyridine, picoline, and isoquinoline. Among them, at least one compound selected from hydroxypyridine-based compounds represented by the following Formula (I) and imidazole-based compounds represented by the following Formula (II) are preferably used as the catalyst.

(I)

$$\begin{array}{c} R_3 \\ R_4 \diagup\diagdown R_2 \\ R_5 \diagdown N \diagup R_1 \end{array}$$

(In the Formula, at least one of $R_1$, $R_2$, $R_3$, $R_4$, and $R_5$ represents a hydroxyl group. When not represents a hydroxyl group, each represents any one of a hydrogen atom, an aliphatic group having 1 to 30 carbon atoms, an aromatic group having 6 to 30 carbon atoms, a cycloalkyl group having 4 to 30 carbon atoms, an aralkyl group having 7 to 30 carbon atoms, and a formyl group.)

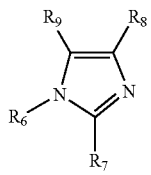

(II)

(In the Formula, $R_6$, $R_7$, $R_8$, and $R_9$ independently represent any one of a hydrogen atom, an aliphatic group having 1 to 30 carbon atoms, an aromatic group having 6 to 30 carbon atoms, a cycloalkyl group having 4 to 30 carbon atoms, an aralkyl group having 7 to 30 carbon atoms, and a formyl group.)

Specific examples of hydroxypyridine-based compounds in Formula (I) include 2-hydroxypyridine, 3-hydroxypyridine, 4-hydroxypyridine, 2,6-dihydroxypyridine, 3-hydroxy-6-methylpyridine, and 3-hydroxy-2-methylpyridine.

Each of $R_5$, $R_6$, $R_7$, and $R_8$ in Formula (II) preferably represents an aralkyl group, a vinyl group, a hydroxyalkyl group, or a cyanoalkyl group, each having 1 to 17 carbon atoms, when it represents, for example, an aliphatic group; preferably represents a phenyl group when it represents an aromatic group; and preferably represents a benzyl group when it represents an aralkyl group.

Specific examples of imidazole-based compounds in Formula (II) include. 1-methylimidazole, 1-ethylimidazole, 1-propylimidazole, 1-phenylimidazole, 1-benzylimidazole, 1-vinylimidazole, 1-hydroxyethylimidazole, 2-methylimidazole, 2-ethylimidazole, 2-propylimidazole, 2-isopropylimidazole, 2-butylimidazole, 2-undecylimidazole, 2-heptadecylimidazole, 2-phenylimidazole, 2-benzylimidazole, 4-methylimidazole, 4-phenylimidazole, 4-benzylimidazole, 1,2-dimethylimidazole, 1,4-dimethylimidazole, 1,5-dimethylimidazole, 1-ethyl-2-methylimidazole, 1-vinyl-2-methylimidazole, 2,4-dimethylimidazole, 2-ethyl-4-methylimidazole, 2-phenyl-4-methylimidazole, 2-butyl-4-hydroxymethylimidazole, 2-butyl-4-formylimidazole, 2,4-diphenylimidazole, 4,5-dimethylimidazole, 4,5-diphenylimidazole, 1-benzyl-2-methylimidazole, 1-benzyl-2-phenylimidazole, 1,2,5-trimethylimidazole, 1,4,5-trimethylimidazole, 1-methyl-4,5-diphenylimidazole, 2-methyl-4,5-diphenylimidazole, 2,4,5-trimethylimidazole, 2,4,5-triphenylimidazole, 1-cyanoethyl-2-methylimidazole, 1-cyanoethyl-2-ethyl-4-methylimidazole, 1-cyanoethyl-2-undecylimidazole, and 1-cyanoethyl-2-phenylimidazole.

Since the hydroxypyridine-based compounds represented by Formula (I) and the imidazole-based compounds represented by Formula (II) have the effect of accelerating a cyclodehydration reaction, when at least one compound selected from these compounds is added, the cyclodehydration can be carried out by a heat treatment at a low temperature in a short time and, therefore, this is preferable because of an improvement in the production efficiency. More preferably, the amount of the compound used is at least 10 mole percent relative to a repeating unit of polyamic acid and, further preferably, is at least 50 mole percent. When the amount of addition is within such a preferable range relative to a repeating unit of polyamic acid, the effect of causing cyclodehydration even at a low-temperature in a short time can be adequately maintained. Repeating units of polyamic acid may remain not underwent the cyclodehydration. However, when polyamic acids are adequately underwent the cyclodehydration and the proportion of the polyamic acids converted to polyimides is increased, the solvent resistance and the wet heat resistance are more preferably improved. The upper limit of the amount of addition is not specifically limited. However, in general, 300 mole percent or less relative to a repeating unit of polyamic acid is preferable from the viewpoint of controlling the raw material cost at a low level.

In the present invention, it is particularly preferable that at least 70 percent and 100 percent or less of the total structural units of the polyimide are structural units represented by the following Formula (III).

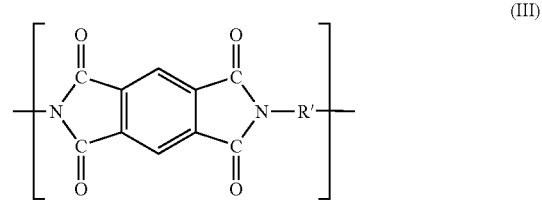

(III)

(In Formula (III), R' represents at least one group selected from groups represented by the following Formula (IV).)

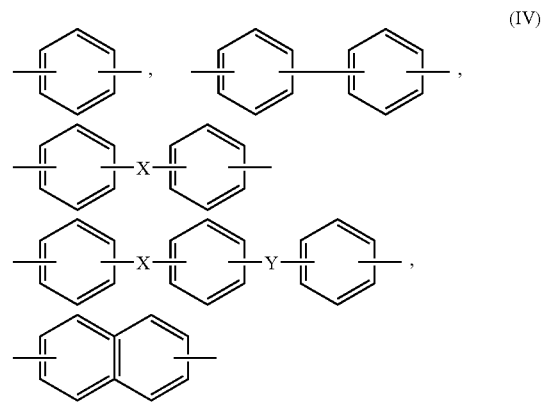

(IV)

(In Formula (IV), Y represents at least one group selected from groups represented by the following Formula (V).)

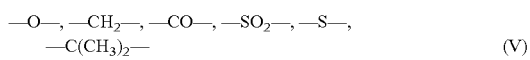

(V)

If at least 70 percent of the total structural units of the polyimide are structural units not represented by the following Formula (III), the flame-retardant effect may be lowered, or the flame-retardant effect may not be exerted unless the laminated layer thickness is increased, so that the superiority in the productivity and the cost may not be held. The polyimide including more than 30 percent of structural units not represented by the following Formula (III) tends to cause an expensive raw material cost in synthesis thereof, and problems may occur in that the cost of the flame-retardant polyester film is increased, and the like.

More preferably, the polyimide includes at least 70 percent of structural units represented by the following Formula (VI). The polyimide including at least 90 percent of structural units represented by the following Formula (VI) is particularly preferable.

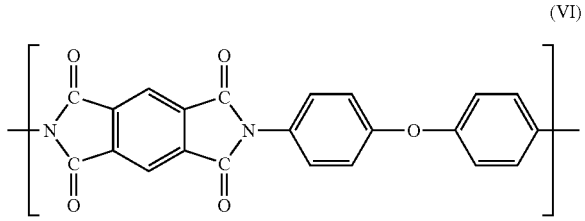

(VI)

Preferably, the resin layer in the present invention contains a compound, which generates the above-described non-flammable gases, besides the resin component. When the compound which generates the above-described non-flammable gases is contained, the non-flammable gas generating rate becomes readily controlled within a preferable range and, therefore, the above-described flame-retardant effect is readily exerted. The compound which generates the non-flammable gases is not specifically limited, and examples of compounds include inorganic carbonates, inorganic hydroxides, triazine-based compounds, guanidine-based compounds, guanylurea-based compounds, and halogen-containing compounds. These can be used alone or in combination. Among them, inorganic hydroxides and/or triazine-based compounds are preferable from the viewpoint of the flame retardancy and, inorganic hydroxides are particularly preferable. Furthermore, when these compounds are contained, the ink adhesion of the resin layer surface can preferably be increased.

Various inorganic hydroxides can be used. For example, aluminum hydroxide, magnesium hydroxide, calcium hydroxide, and zirconium hydroxide are suitable for the use. Among them, aluminum hydroxide and magnesium hydroxide are preferable. Magnesium hydroxide is particularly preferable from the viewpoint of the flame retardancy. Aluminum hydroxide is preferable because it promotes the degradation of the resin layer to a lesser extent even when the resin layer is exposed to high temperatures and high humidities. Preferably, the average particle diameters of these inorganic hydroxides are 1.5 µm or less from the viewpoint of the flame retardancy, more preferably, is 1.0 µm or less and, further preferably, is 0.8 µm or less. In particular, 0.5 µm or less is preferable. Preferably, these inorganic hydroxides are covered with cover layers made of a zinc compound and/or a boron compound, or are surface-treated with a silane coupling agent, a titanate-based coupling agent, an aluminum-based coupling agent, an aliphatic acid, or the like because the flame retardancy effects is readily exerted.

Examples of triazine-based compounds include melamine sulfate, polymelamine phosphate, melamine, melam, melem, mellon, melamine cyanurate, melamine phosphate, succinoguanamine, ethylenedimelamine, triguanamine, tris(β-cyanoethyl)isocyanurate, acetoguanamine, melem sulfate, and melam sulfate.

Preferably, the amount of addition of the compound which generates non-flammable gases is 1 to 65 percent by weight of the resin layer. If less than 1 percent by weight, the flame-retardant effect may not be adequately exerted. If exceeds 65 percent by weight, the resin layer may become brittle, or the flame-retardant effect may not be exerted. Preferably, the amount of addition is 5 to 60 percent by weight and, more preferably, is 10 to 50 percent by weight. Preferably, the amount of addition of the compound which generates non-flammable gases is 0.01 to. 20 percent by weight of the entire flame-retardant polyester film, more preferably, is 0.01 to 10 percent by weight and, further preferably, is 0.01 to 3 percent by weight.

Preferably, the ratio of thickness of the resin layer to the thickness of the entire flame-retardant polyester film is 0.5 to 30 percent. More preferably, the ratio of thickness of the resin layer is 1.0 to 10 percent and, further preferably, is 1.0 to 5.0 percent. Here, the thickness of the resin layer refers to the total of the resin layers on both surfaces. When the ratio of thickness of the resin layer to the thickness of the entire flame-retardant polyester film is within such a range, the flame-retardant effect is adequately exerted, and the productivity is excellent. At this time, preferably, the thickness of the resin layer is about 0.05 to 10 µm per one surface, more preferably, is 0.1 to 5 µm and, further preferably, about 0.1 to 2.5 µm. If the ratio of thickness of the resin layer is large and/or the thickness of the resin layer is large, the adhesion between the polyester film and the resin layer may be lowered.

With respect to the method for forming the resin layer, for example, the resin layer and the polyester film may be laminated by co-extrusion, the resin layer may be adhered to the polyester film, or the resin layer may be formed by a method in which a solution for forming the resin layer is applied to the polyester film, followed by drying. Among them, in the case where the compound which generates non-flammable gases is included in the resin layer, the method in which the resin layer is formed by coating is preferable because the resin layer can be formed under relatively moderate conditions and, therefore, deterioration of the compound which generates non-flammable gases is readily prevented. Various coating methods, for example, a reverse coating method, a gravure coating method, a rod coating method, a bar coating method, a die coating method, and a knife coating method, may be used as the method for forming the resin layer by coating. In order to efficiently dry the solvent, the heating by infrared rays may be earned out.

Examples of polyesters used for the polyester film include polyethylene terephthalate, polyethylene naphthalate, polypropylene terephthalate, polybutylene terephthalate, and polypropylene naphthalate, and mixtures of at least two of them may be included. These may include other dicarboxylic acid components or diol components by copolymerization within the range of not impairing the effects. Preferably, the limiting viscosity of the polyester (measured in o-chlorophenol at 25° C.) is 0.4 to 1.2 dl/g and, more preferably, is 0.5 to 0.8 dl/g.

Desirably, the polyester film is biaxially oriented from the viewpoint of mechanical characteristics and dimension stability. The term "biaxially oriented" refers to, for example, that an undrawn thermoplastic resin film, in which crystalline orientation is not yet completed, is drawn in each of the longitudinal direction and the lateral direction by about 2.5 to 5.0 times and, thereafter, crystalline orientation is completed by a heat treatment, so that a pattern of biaxial orientation is observed by wide angle X-ray diffraction.

The polyester film used in the present invention is not necessarily a single-layer film, and may be a composite film of at last two layers composed of an inner layer and a surface layer within the range of not impairing the effects of the present invention. Examples thereof include a composite film in which an inner layer contains substantially no particles and a layer containing particles is provided as a surface layer, a composite film in which an inner layer contains coarse particles and a layer containing fine particles is provided as a surface layer, and a composite film in which an inner layer contains fine bubbles and a surface layer contains substantially no bubble. In the above-described polyester film, the inner layer and the surface layer may be made from different polyesters, or be made of the same type of polyester.

Preferably, a primer layer is laminated between the polyester film and the resin layer. Here, the primer layer refers to a layer having the effect of enhancing the adhesion between the polyester film and the resin layer. When the adhesion between the polyester film and the resin layer is high, problems, e.g., peeling of the resin layer, do not readily occur during the processing step to process a flame-retardant film, and the flame-retardant effect is enhanced. The method for laminating the primer layer is not specifically limited, and examples of methods adopted at will include a method in which the primer layer is provided by co-extrusion with the polyester film, and a method in which the polyester film and/or the resin layer is coated with a solution containing a primer-forming component, followed by drying. Examples of materials usable for forming the primer layer include urethane resins, polyester resins, and acrylic resins. These resins may be used alone, or at least two different types of resin may be used in combination. These resins may be modified resins or be copolymers. Preferably, the primer layer contains a cross-linking agent. Examples of usable cross-linking agents include melamine compounds, oxazoline-based cross-linking agents, isocyanate compounds, aziridine compounds, epoxy resins, methylol or alkylol urea-based cross-linking agents, acrylamide-based cross-linking agents, polyamide-based resins, amide epoxy compounds, various silane coupling agents, and various titanate-based coupling agents.

Among them, in particular, a compound having an oxazoline group is preferably contained in the primer layer. When the compound having an oxazoline group is contained in the primer layer, the adhesion between the polyester film and the resin layer is not lowered even in the case of immersion in a solvent or exposure to high temperatures and high humidities and, therefore, this is preferable. More preferably, the primer layer contains the compound having an oxazoline group and contains a polyester resin from the viewpoint of the adhesion between the polyester film and the resin layer after a solvent treatment and a wet heat treatment are carried out. High adhesion after the solvent treatment is preferable because problems, e.g., peeling of the resin layer, do not readily occur even when the flame-retardant film is processed by the use of a solvent. High adhesion after the wet heat treatment is preferable because the environmental resistance is increased when the flame-retardant film is processed and is used as an electrical insulating material.

The oxazoline-containing compound may be a compound having an oxazoline group as a functional group, and preferably is an oxazoline-containing copolymer prepared by copolymerization of at least one monomer having an oxazoline group and at least one type of other monomer.

Examples of usable monomers having an oxazoline group include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, and 2-isopropenyl-5-ethyl-2-oxazoline. These may be used alone or in combination. Among them, 2-isopropenyl-2-oxazoline is suitable because of a high industrial availability.

The other monomer to be copolymerized with the monomer having an oxazoline group is not specifically limited as long as the monomer can be copolymerized with the monomer having an oxazoline group. Specific examples of monomers include acrylates or methacrylates, e.g., methyl acrylate, methyl methacrylate, ethyl acrylate, ethyl methacrylate, butyl acrylate, butyl methacrylate, 2-ethylhexyl acrylate, and 2-ethylhexyl methacrylate; unsaturated carboxylic acids, e.g., acrylic acid, methacrylic acid, itaconic acid, and maleic acid; unsaturated nitriles, e.g., acrylonitrile and methacrylonitrile; unsaturated amides, e.g., acrylamide, methacrylamide, N-methylolacrylamide, and N-methylolmethacrylamide; vinyl esters, e.g., vinyl acetate and vinyl propionate; vinyl ethers, e.g., methyl vinyl ether and ethyl vinyl ether; olefins, e.g., ethylene and propylene; halogen-containing-$\alpha$, $\beta$-unsaturated monomers, e.g., vinyl chloride, vinylidene chloride, and vinyl fluoride; and $\alpha,\beta$-unsaturated aromatic monomers, e.g., styrene and $\alpha$-methylstyrene. These can be used alone or in combination.

The resin layer and the primer layer may contain various additives, resin compositions, cross-linking agents, and the like within the range of not impairing the effects. For example, antioxidants, heat stabilizers, ultraviolet absorbers, organic particles, inorganic particles, pigments, dyes, antistatic agents, nucleators, flame retardants, acrylic resins, polyester resins, urethane resins, polyolefin resins, polycarbonate resins, alkyd resins, epoxy resins, urea resins, phenolic resins, silicone resins, rubber-based resins, wax compositions, melamine compounds, oxazoline-based cross-linking agents, methylol or alkylol urea-based cross-linking agents, acrylamide and polyamide-based resins, epoxy resins, isocyanate compounds, aziridine compounds, various silane coupling agents, and various titanate-based coupling agents may be used.

Among them, inorganic particles, for example, silica, colloidal silica, alumina, alumina sol, kaolin, talc, mica, calcium carbonate, barium sulfate, carbon black, zeolite, titanium oxide, and metal fine powders, are preferably added, because the slipperiness, the scratch resistance, and the like are improved. Preferably, the average particle diameter of the inorganic particles is 0.005 to 5 µm and, more preferably, is about 0.05 to 1 µm. Preferably, the amount of addition thereof is 0.05 to 20 percent by weight and, more preferably, is 0.1 to 10 percent by weight.

An example of preferable methods for manufacturing the flame-retardant polyester film will be described below. However, this disclosure is not limited.

Polyethylene terephthalate is fed into an extruder, and is extruded from a T-shaped die so as to be molded into a sheet. The resulting sheet is heated to a temperature higher than or equal to the glass transition temperature of the polyethylene terephthalate, and is drawn in the longitudinal direction. After a coating solution for forming a primer is applied to both surfaces of the polyethylene terephthalate film, the resulting film is guided to a tenter while both ends of the film are held with clips. The film is heated to a temperature higher than or equal to the glass transition temperature of the polyethylene terephthalate, and is drawn in the lateral direction, followed by a heat treatment at 200° C. to 250° C., so as to prepare a polyester film on which the primer layers are laminated. Polyamic acid is dissolved in N-methyl-2-pyrrolidone, and magnesium hydroxide is added thereto. The resulting solution is applied by a bar coating method to the primer layers on both surfaces of the film, followed by drying, and cyclodehydration is carried out at 150° C. to 250° C., so that a flame-retardant polyester film is prepared.

In general, the thickness of the flame-retardant polyester film is about 5 to 500 µm, and can appropriately be selected in accordance with uses.

The thus prepared flame-retardant polyester film has excellent flame retardancy. The flame-retardant polyester film has adequate flame retardancy without adding a flame retardant into the polyester film, nor including halogen-containing component or phosphorous component in the polyester by copolymerization. Consequently, the flame retardancy can be imparted without degrading the mechanical characteristics inherent to the polyester film. Furthermore, generation of dioxins and gases which cause contamination in the processing step can be reduced. Therefore, the flame-retardant polyester film is suitable for use in electrical insulating materials for adhesive tapes, flexible printed circuits, membrane switches, film heaters, flat cables, insulated motors, electronic components, and the like and, in addition, is suitable for use as magnetic recording materials, capacitor materials, packaging materials, building materials, and various industrial materials.

The processed products including the flame-retardant polyester film, that is, adhesive tapes, flexible printed circuits, membrane switches, film heaters, flat cables, and the like, have excellent flame retardancy and, furthermore, have excellent workability because seepage of the flame retardant and the like does not occur.

One example of the adhesive tape has a configuration in which an adhesive layer is laminated on at least one surface of the above-described flame-retardant polyester film. An anchor coat layer and the like may be provided between the flame-retardant polyester film and the adhesive layer. The adhesive layer is not specifically limited. The adhesive layer including an rubber-based adhesive, e.g., natural rubber, synthesized isoprene rubber, styrene-butadiene rubber, or styrene-isoprene-styrene block copolymer; a vinyl-based adhesive, e.g., polyvinyl butyral or poly-vinyl ether; a silicone-based adhesive; an acrylic adhesive; or the like as a primary constituent is used and, if necessary, an adhesion-imparting resin, a softener, an antioxidant, a flame retardant, a curing agent, and the like may be added. The thickness of the adhesive layer may be within the range of about 5 to 50 μm. The adhesive layer can be laminated by a known method, e.g., lamination or coating. The adhesive tape is suitable for use in fields of the electrical insulating materials, building materials, and the like in which the flame retardancy is required.

One example of the flexible printed circuits of the present invention has a configuration in which conductive circuits are provided on the above-described flame-retardant polyester film. An anchor coat layer, a bonding agent layer, an adhesive layer, and the like may be provided between the flame-retardant polyester film and the conductive circuits. The conductive circuits can be formed by a known method in which, on the flame-retardant polyester film, a metal foil is laminated, followed by etching; a metal is evaporated; a metal is sputtered; a conductive paste is screen-printed; or the like. The flexible printed circuits are suitable for use in components of equipment, e.g., personal computers and printers; electronic components of furniture, automobiles, and the like; portable electronic and electrical equipment, e.g., notebook personal computers, cellular phones, and IC cards.

One example of the membrane switch of the present invention has a configuration in which a spacer film is interposed between two sheets of the above-described flame-retardant polyester films provided with conductive circuits thereon. At this time, conductive portions provided on the two sheets are arranged to face each other, and the spacer film is provided with a through hole at the portion corresponding to the conductive portion. The above-described flame-retardant polyester film is also suitable for use as the spacer film. An anchor coat layer, an adhesive layer, a bonding agent layer, and the like may be provided between each layer. The thickness of the conductive circuit may be within the range of about 20 to 100 μm, and the thickness of the spacer film may be about 50 to 400 μm. The conductive circuits can be formed by a known method in which, on the flame-retardant polyester film, a metal foil is laminated, followed by etching; a metal is evaporated; a metal is sputtered; a conductive paste is screen-printed; or the like. The membrane switch is suitable for use as membrane switches used in electrical products, e.g., desktop calculators and keyboards.

One example of the film heater has a configuration in which conductive circuits and copper wires to become heating elements are disposed on the above-described flame-retardant polyester film, or a heat generating layer is laminated while a conductive powder, e.g., carbon, is dispersed in a binder resin, e.g., synthetic rubber, in the heat generating layer. At this time, the conductive circuits and the copper wires or the heat generating layer are sandwiched between two sheets of the above-described flame-retardant polyester film, or are sandwiched between one sheet of the above-described flame-retardant polyester film and another film, nonwoven fabric, adhesive layer, or the like. An anchor coat layer, an adhesive layer, a bonding agent layer, and the like may be provided between each layer. The conductive circuit can be formed by a known method in which, on the flame-retardant polyester film, a metal foil is laminated, followed by etching; a metal is evaporated; a metal is sputtered; a conductive paste is screen-printed; or the like. The film heater is suitable for use as various heating appliance and various heaters.

One example of the flat cable has a configuration in which a plurality of signal lines arranged parallel to each other are sandwiched between two films. Among the two films, at least one film is made of the above-described flame-retardant polyester film. A known method can be used as the method for sandwiching the signal lines. For example, after bonding agent layers (heat seal layers) which are melt by heating or bonding agent layers which are cured by electron beams, ultraviolet rays, or the like are provided on two films, the resulting films are over-lapped in order that the surfaces provided with the bonding agents face each other, signal lines are interposed in the space therebetween, and thermocompression bonding, electron beam irradiation, ultraviolet irradiation, or the like is carried out. An anchor coat layer, an adhesive layer, a bonding agent layer, and the like may be provided between each layer. Tin-plated copper foil or the like is used as the signal line. The flat cable is suitable for use in wirings in various OA equipment, telephones, sound equipment, electronic components of automobiles, and the like.

[Methods for measuring characteristics and methods for evaluating effects]

Methods for measuring characteristics and methods for evaluating effects will be described below.

(1) Ratio (R) of thickness of resin layer to entire flame-retardant polyester film A section was cut from the flame-retardant polyester film, the section was observed with a transmission electron microscope Model HU-12 manufactured by Hitachi, Ltd., and the thickness ($t_1$) of one surface of the resin layer, the thickness ($t_2$) of the other surface of the resin layer, and the thickness ($t_3$) of the entire flame-retardant polyester film were measured. When a mixed phase was observed, the thickness of the resin layer including the mixed phase was taken as the thickness of the resin layer. The ratio R of the thickness of the resin layer to the entire flame-retardant polyester film at this time was determined from the following equation.

$$R \text{ (percent)} = \{(t_1+t_2)/t_3\} \times 100$$

(2) Thermogravimetry

A sample was taken from the resin layer portion of the flame-retardant polyester film, and the weight of the sample was measured with Thermobalance TGA-50 manufactured by SHIMADZU CORPORATION in an atmosphere in which air was flowed at 50 ml/min. The weight of the sample "$Wc_0$ at 25° C. before a heat treatment was determined. The temperature of the sample was raised from room temperature to 800° C. at 10° C./min, while the weight $Wc_1$ when the temperature reached 600° C. and the weight $Wc_2$ when the temperature reached 800° C. were determined, and the value of the following Formula (1) was calculated.

$$(Wc_1-Wc_2)/Wc_0 \times 100 \text{ (percent)} \quad (1)$$

(3) Non-flammable gas generating rate

A sample was taken from the resin layer portion of the flame-retardant polyester film, and the thermogravimetry-mass spectrometry (TG-MS) was carried out with an apparatus in which Thermobalance TG-40 manufactured by SHIMADZU CORPORATION and Gas Chromatograph-Mass Spectrometer GCMS-QP1000 manufactured by SHIMADZU CORPORATION were connected through a connection tube, so that the components of the generated gases and the amount of generation are analyzed. Thermobalance TG-40 was used after being modified to prevent the air from leaking therein. The non-flammable gas generating rate was determined from the weight $Wg_0$ of the sample and the weight $Wg_1$ of the generated non-flammable gases based on the following Formula (2).

$$Wg_1/Wg_0 \times 100 \text{ (percent)} \quad (2)$$

The measurement was carried out in an atmosphere in which helium gas was flowed at 50 ml/min, the temperature increasing rate of the thermobalance was controlled at 10° C./min, and the maximum temperature reached was controlled at 500° C.

The non-flammable gas generating rates were determined with respect to temperature ranges of 180° C. to 250° C., 250° C. to 300° C., and 300° C. to 450° C.

(4) Flame retardancy

Samples were cut from the flame-retardant polyester film, the adhesive tape, the flexible printed circuits, the membrane switch, the film heater, and the flat cable into the shape of a slip of 50 mm×200 mm, and were bended into the shape of a cylinder of 12.7 mm in diameter and 200 mm in length. The resulting cylindrical sample was held at the top end in the longitudinal direction in order that the longitudinal direction became perpendicular to the earth, the bottom end was exposed to a flame of about 20 mm for 3 seconds and, thereafter, the flame was removed. The burning time of the sample after the removal of the flame was measured (the burning time at the first contact with flame). When extinguishment occurred before the sample was burnt off, after the extinguishment, the second contact with flame and removal of flame were carried out as in the first time, and the burning time of the sample after removal of the flame was measured (the burning time at the second contact with flame). This test was repeated with respect to five samples. The flame retardancy was evaluated in three levels (⊙: self-distinguished in less than 35 seconds, ○: self-distinguished in 35 to 50 seconds, and x: not self-distinguished or burnt off in 50 seconds or less) based on the total of the burning times of five samples at the first contact and the second contact with flame. The results classified into ⊙ and ○ were evaluated as good.

(5) Ink Adhesion

Printing ink (Tetoron 990 black manufactured by JUJO CHEMICAL CO., Ltd.) was diluted with a Tetoron standard solution, the resulting solution was applied to the flame-retardant polyester film with a bar coater, and was dried at 60° C., so that an ink layer having a thickness of 8 μm was formed. The resulting ink layer were provided with 100 crosscuts of 1 mm², and a cellophane tape manufactured by NICHIBAN CO., LTD., was laminated on the surface provided with the crosscuts. A rubber roller was allowed to reciprocate three times with a load of 19.6 N so as to press the tape against the ink layer and, thereafter, the tape was peeled in a direction at 90 degrees. Evaluation was carried out based on the number of remaining ink layers, and the results were classified into two levels (○: 50 to 100, and x: 0 to 0.49). The results classified into ○ were evaluated as good.

(6) Adhesion of Resin Layer Under Normal State

The resin layer was provided with 100 crosscuts of 1 mm² without penetrating the flame-retardant polyester film, and a cellophane tape manufactured by NICHIBAN CO., LTD., was laminated on the surface provided with the crosscuts. A rubber roller was allowed to reciprocate three times with a load of 19.6 N so as to press the tape against the resin layer and, thereafter, the tape was peeled in a direction at 90 degrees. Evaluation was carried out based on the number of remaining resin layers, and the results were classified into two levels (○: 90 to 100, and x: 0 to 90). The results classified into ○ were evaluated as good adhesion.

(7) Adhesion of Resin Layer After Solvent Treatment

The flame-retardant polyester film was immersed in various solvents shown in Table 2 for 5 minutes, followed by drying at 100° C. for 2 minutes so as to prepare samples. The resulting samples were subjected to the evaluation of adhesion as in the above-described item (6).

(8) Adhesion of Resin Layer After Wet Heat Treatment

The flame-retardant polyester film was stood at 85° C. at a relative humidity of 85 percent for 240 hours so as to prepare a sample. The resulting sample was subjected to the evaluation of adhesion as in the above-described item (6).

Next, the flims will be described below with reference to the examples. However,this disclosure is not limited to them. A coating solution and the like used in the examples will be described now.

≦Coating Solution for Forming Resin Layer>

(1) Coating Solution A

Weighed 4,4'-diaminodiphenyl ether was put in a dried flask together with N-methyl-2-pyrrolidone, and agitation was carried out to dissolve. The resulting solution was mixed with pyromellitic dianhydride in an amount corresponding to 100 moles relative to 100 moles of 4,4'-diaminodiphenyl ether in order that the reaction temperature became 60° C. or less. Subsequently, the polymerization was terminated at the time when the viscosity became constant (end point of polymerization), so that a polymerization solution of polyamic acid was prepared. The resulting solution was diluted with N-methyl-2-pyrrolidone in order that the solid concentration became 10 percent by weight. Thereafter, a solution, in which magnesium hydroxide particles (MGZ-3 manufactured by Sakai Chemical Industry Co., Ltd., average particle diameter 0.1 μm) was dispersed in N-methyl-2-pyrrolidone in order that the solid concentration became 10 percent by weight, was added, so as to satisfy polyamic acid/magnesium hydroxide=70/30 in terms of weight ratio of solids. Furthermore, 4-hydroxypyridine was added in an amount corresponding to 100 mole percent relative to repeating units of polyamic acid, and this solution was taken as a coating solution A.

(2) Coating Solution B

Polyimide solution (RIKACOAT (®) SN-20 manufactured by New Japan Chemical Co., Ltd.) was diluted with N-methyl-2-pyrrolidone in order that the solid concentration became 10 percent by weight. Thereafter, a solution, in which magnesium hydroxide particles (MGZ-3 manufactured by Sakai Chemical Industry Co., Ltd., average particle diameter 0.1 μm) was dispersed in N-methyl-2-pyrrolidone in order that the solid concentration became 10 percent by weight, was added, so as to satisfy polyamic acid/magnesium hydroxide=70/30 in terms of weight ratio of solids. The resulting solution was taken as a coating solution B.

(3) Coating Solution C

A coating solution C was prepared as in the coating solution A except that melamine cyanurate (MC-600 manufactured by NISSAN CHEMICAL INDUSTRIES, LTD., particle diameter 1 to 5 μm) was used instead of magnesium hydroxide particles.

(4) Coating Solution D

A coating solution D was prepared as in the coating solution A except that 4-hydroxypyridine was not added before application.

(5) Coating Solutions E, F, and G

Coating solutions E, F, and G were prepared as in the coating solution A except that the mixing ratio of polyamic acid/magnesium hydroxide was controlled at 95/5 (Coating solution E), 50/50 (Coating solution F), and 30/70 (Coating solution G) in terms of weight ratio of solids.

(6) Coating Solution H

A coating solution H was prepared as in the coating solution A except that magnesium hydroxide particles were not added.

(7) Coating Solution I

A coating solution I was prepared as in the coating solution A except that a solution, in which magnesium hydroxide particles (MGZ-3 manufactured by Sakai Chemical Industry Co., Ltd., average particle diameter 0.1 μm) was dispersed in N-methyl-2-pyrrolidone in order that the solid concentration became 10 percent by weight, and an N-methyl-2-pyrrolidone dispersion of colloidal silica (OSCAL (®) 5116 manufactured by CATALYSTS & CHEMICALS IND. CO., LTD., solids concentration 10 percent by weight, primary particle diameter 80 nm) were added to a polyamic acid solution, so as to satisfy polyamic acid/magnesium hydroxide/silica=50/5/45.

(8) Coating Solution J

A coating solution J was prepared as in the coating solution A except that aluminum hydroxide particles (HIGILITE (®) H-42M manufactured by SHOWA DENKO K.K., average particle diameter 1.1 μm) was used instead of magnesium hydroxide particles.

(9) Coating Solution K

A coating solution K was prepared as in the coating solution A except that KISUMA (®) 5E manufactured by Kyowa Chemical Industry Co., Ltd., (average particle diameter 0.8 μm) was used as magnesium hydroxide particles.

(10) Coating Solution L

A coating solution L was prepared as in the coating solution J except that the mixing ratio of polyamic acid/magnesium hydroxide was controlled at 97/3 in terms of weight ratio of solids.

(11) Coating Solution M

A coating solution M was prepared as in the coating solution J except that the mixing ratio of polyamic acid/magnesium hydroxide was controlled at 40/60 in terms of weight ratio of solids, and 4-hydroxypyridine was not added before application.

(12) Coating Solution N

A coating solution N was prepared as in the coating solution A except that aluminum hydroxide particles (HIGILITE (®) H-43M manufactured by SHOWA DENKO K.K., average particle diameter 0.75 μm) was used instead of magnesium hydroxide particles, and 2-methylimidazole was added instead of 4-hydroxypyridine before application.

≦Coating Solution for Forming Primer Layer>

(1) Coating Solution 1

The following polyester resin 1 was mixed with the following melamine compound 1 serving as a cross-linking agent at a ratio of 85/15 in terms of weight ratio of solids, the resulting mixture was diluted with a mixed solvent of isopropyl alcohol and water (10/90 (weight ratio)) to have a solid concentration of 3 percent by weight, and the resulting diluted solution was taken as a Coating solution 1 for forming a primer layer.

*Polyester Resin 1:

| *acid components | |
|---|---|
| terephthalic acid | 60 mole percent |
| Isophthalic acid | 14 mole percent |
| trimellitic acid | 20 mole percent |
| sebacic acid | 6 mole percent |
| *diol components | |
| ethylene glycol | 28 mole percent |
| neopentyl glycol | 38 mole percent |
| 1,4-butanediol | 34 mole percent |

The above-described polyester resin 1 (Tg: 20° C.) was allowed to become a water-based resin by ammonia water, so that water dispersion was prepared.

*Melamine Compound 1:

A high solid type amino resin, CYMEL (®) 325 (iminotype methylated melamine) manufactured by Cytec Industries Inc. was taken as a melamine compound 1.

(2) Coating Solution 2

The above-described polyester resin 1 was mixed with EPOCROS (®) WS-700 manufactured by NIPPON SHOKUBAI CO., LTD., serving as the oxazoline-containing compound 1 at a ratio of 75/25 in terms of weight ratio of solids, to have a solid concentration of 3 percent by weight, and the resulting solution was taken as the Coating solution 2 for forming a primer layer.

EXAMPLE 1

Polyethylene terephthalate resin pellets (hereafter may be referred to as PET pellets) containing 0.015 percent by weight of colloidal silica having an average particle diameter of 0.4 μm and 0.005 percent by weight of colloidal silica having an average particle diameter of 1.5 μm was adequately dried in a vacuum, was fed into an extruder, was melt at 285° C., and was extruded from a T-shaped die into a sheet. The resulting sheet was wound around a mirror-finished casting drum at a surface temperature of 25° C. by an electrostatic casting method to be cooled and solidified, so that an undrawn film was prepared. The resulting undrawn film was heated to 90° C., and was drawn by 3.3 times in the longitudinal direction, so that a uniaxially-drawn film (hereafter referred to as a base PET film) was prepared. Both surfaces of the resulting base PET film were subjected to a corona discharge treatment in air, so that the surface wetting tension of the base PET film became 55 mN/m. Both surfaces of the base PET film were coated with a coating solution 1 serving as a coating solution for forming a primer layer. Subsequently, the base PET film coated with the coating-solution for forming a primer layer was guided to a preheating zone while being held with clips, and was dried at 90° C. The resulting film was drawn by 3.5 times in the lateral direction at 105° C. in a heating zone, and furthermore, was continuously subjected to a heat treatment at 220° C. in a heating zone, so that a laminated PET film, in which crystalline orientation was completed, was prepared. Both surfaces of the resulting laminated PET film are coated with the coating solution A, and drying at 130° C. and a heat treatment at 200° C. were carried out, so that a flame-retardant polyester film was prepared. The thickness of the entire film was 100 μm, and the thickness of the resin layer was 1.5 μm per one surface. The results are collectively shown in Table 1.

EXAMPLES 2 to 8

Each flame-retardant polyester film was prepared as in Example 1 except that both surfaces of the laminated PET film was coated with the coating solution C, the coating solution D, the coating solution E, the coating solution F, the coating solution I, the coating solution J, or the coating solution K instead of the coating solution A.

EXAMPLE 9

A flame-retardant polyester film was prepared as in Example 1 except that the thickness of the entire film was controlled at 50 μm, and the thickness of the resin layer was controlled at 0.9 μm per one surface.

EXAMPLE 10

A flame-retardant polyester film was prepared as in Example 1 except that the coating solution B was taken as the coating solution.

EXAMPLE 11

A film was prepared as in Example 1 except that the thickness of the entire film was controlled at 100 μm, and the thickness of the resin layer was controlled at 4.0 μm per one surface.

EXAMPLE 12

A flame-retardant polyester film was prepared as in Example 1 except that the thickness of the entire film was controlled at 50 μm, and the thickness of the resin layer was controlled at 0.4 μm per one surface.

EXAMPLE 13

A sheet was cut from the flame-retardant polyester film prepared in Example 9. One surface of the resulting sheet was coated with a solution in which an acrylic adhesive (COPO-NYL (®) 5407 manufactured by The Nippon Synthetic Chemical Industry. Co., Ltd.) and a curing agent (Coronate (®) L-55E manufactured by NIPPON POLYURETHANE INDUSTRY CO., LTD.) were mixed in order to satisfy acrylic adhesive/curing agent=100/2 in terms of parts by weight, drying was carried out at 100° C. and, thereafter, aging was carried out at room temperature for 5 days, so that an adhesive tape, in which an adhesive layer of 10 μm in thickness was laminated, was prepared. The result of the flame retardancy test of the resulting adhesive tape was evaluated as ⊙.

EXAMPLE 14

A sheet was cut from the flame-retardant polyester film prepared in Example 9. One surface of the resulting sheet was printed with conductive circuits of 20 μm in thickness by a screen printing method through the use of a conductive resin paste in which a carbon powder was dispersed, so that flexible printed circuits were prepared. The result of the flame retardancy test of the resulting flexible printed circuits was evaluated as ⊙).

EXAMPLE 15

A sheet was cut from the flame-retardant polyester film prepared in Example 9. One surface of the resulting sheet was printed with conductive circuits of 20 μm in thickness by a screen printing method through the use of a conductive resin paste in which a silver powder was dispersed. One surface of another sheet cut from the flame-retardant polyester film prepared in Example 9 was printed with conductive circuits of 20 μm in thickness by a screen printing method through the use of a conductive resin paste in which a silver powder was dispersed. Furthermore, adhesive tapes #7100 for TAB, manufactured by Toray Industries, Ltd., were laminated on both surfaces of the flame-retardant polyester film prepared in Example 1, so that a spacer film was prepared. The spacer film was sandwiched with two sheets on which conductive circuits had been printed, so that a membrane switch was prepared. At this time, the conduction portions provided on the two sheets were arranged to face each other, and the spacer film was provided with a through hole at the portion corresponding to the conduction portion. The result of the flame retardancy test of the resulting membrane switch was evaluated as ⊙.

EXAMPLE 16

A sheet was cut from the flame-retardant polyester film prepared in Example 9. One surface of the resulting sheet was provided with a heat generating layer of 50 μm in thickness by coating a diethylbenzene solution mixed in order to satisfy ethylene-vinyl acetate copolymer/carbon powder=100/70 in terms of parts by weight. Conductive circuits of 20 μm in thickness was printed on the heat generating layer by a screen printing method through the use of a conductive resin paste in which a carbon powder was dispersed. An adhesive tape #7100 for TAB, manufactured by Toray Industries, Ltd., was laminated on the surface of the heat generating layer, printed with conductive circuits. Finally, another sheet cut from the film prepared in Example 9 was laminated on the adhesive tape surface, so that a film heater was prepared. The result of the flame retardancy test of the resulting film heater was evaluated as ⊙.

EXAMPLE 17

A sheet was cut from the flame-retardant polyester film prepared in Example 9. One surface of the resulting sheet was coated with a solution in which a polyester-based bonding agent (ARONMELT (®) PES-35S40 manufactured by TOA-GOSEI Co., Ltd.) aluminum hydroxide particles (HIGILITE (®) H-42M manufactured by SHOWA DENKO K.K., average particle diameter 1.1 μm) were mixed in order to satisfy polyester-based bonding agent/aluminum hydroxide=50/50 in terms of weight ratio of solids, followed by drying, so that a heat seal layer of 30 μm in thickness was laminated. One surface of another sheet cut from the film prepared in Example 9 was subjected to a similar operation, so that a heat seal layer of 30 μm in thickness was laminated. The resulting two sheets were overlapped in order that the surfaces provided with heat seal layers faced each other, a plurality of tin-plated copper foils of 0.8 mm in width and 50 μm in thickness were interposed equidistantly in the space therebetween, and these were subjected to thermocompression bonding at 150° C. with a roll, so that a flat cable was prepared. The result of the flame retardancy test of the resulting flat cable was evaluated as ⊙.

EXAMPLE 18

A film was prepared as in Example 1 except that the coating solution 2 was used as the coating solution for forming a primer layer., both surfaces of the laminated PET film were coated with the coating solution N instead of the coating solution A, the thickness of the entire film was controlled at 75 μm, and the thickness of the resin layer was controlled at 1.7 μm per one surface.

EXAMPLE 19

A film was prepared as in Example 1 except that both surfaces of the laminated PET film were coated with the coating solution L instead of the coating solution A, the thickness of the entire film was controlled at 50 μm, and the thickness of the resin layer was controlled at 1.5 μm per one surface.

EXAMPLE 20

A film was prepared as in Example 1 except that both surfaces of the laminated PET film were coated with the coating solution M instead of the coating solution A, the thickness of the entire film was controlled at 50 μm, and the thickness of the resin layer was controlled at 1.5 μm per one surface.

COMPARATIVE EXAMPLES 1 AND 2

Each film was prepared as in Example 1 except that both surfaces of the laminated PET film were coated with the coating solution G or the coating solution H instead of the coating solution A.

COMPARATIVE EXAMPLE 3

A film was prepared as in Example 1 except that simply one surface was coated with the coating solution A, and the final thickness thereof was controlled at 3.0 μm. The resulting film had poor flame retardancy.

The results of the evaluation of characteristics of Examples 1 to 12, 18, 19, and 20, and Comparative examples 1 to 3 are shown in Table 1. With respect to Examples 1 to 12, 18, 19, and 20, the results were good in all items. However, with respect to Comparative examples 1 to 3, there was an unfavorable point in at least one item. As shown in Table 2, with respect to Example 18, the adhesion between the polyester film and the resin layer was excellent even when the solvent treatment and the wet heat treatment were carried out.

TABLE 1

| | Coating solution for forming resin layer | Lamination surface | Ratio (R) of thickness of resin layer (%) | Value of Formula (1) (%) | Non-flammable gas generating rate (%) 180° C. to 250° C. | 250° C. to 300° C. | 300° C. to 450° C. | Total 180° C. to 450° C. | Flame retardancy | Ink adhesion |
|---|---|---|---|---|---|---|---|---|---|---|
| Example 1 | Coating solution A | Both surfaces | 3.0 | 40 | 1 | 1 | 10 | 12 | ⊚ | ○ |
| Example 2 | Coating solution C | Both surfaces | 3.0 | 40 | 1 | 1 | 7 | 9 | ⊚ | ○ |
| Example 3 | Coating solution D | Both surfaces | 3.0 | 30 | 5 | 2 | 10 | 17 | ⊚ | ○ |
| Example 4 | Coating solution E | Both surfaces | 3.0 | 50 | 1 | 1 | 2 | 4 | ○ | ○ |
| Example 5 | Coating solution F | Both surfaces | 3.0 | 20 | 1 | 1 | 14 | 16 | ⊚ | ○ |
| Example 6 | Coating solution I | Both surfaces | 3.0 | 20 | 1 | 1 | 2 | 4 | ○ | ○ |
| Example 7 | Coating solution J | Both surfaces | 3.0 | 40 | 3 | 5 | 4 | 12 | ○ | ○ |
| Example 8 | Coating solution K | Both surfaces | 3.0 | 40 | 1 | 1 | 10 | 12 | ○ | ○ |
| Example 9 | Coating solution A | Both surfaces | 3.6 | 40 | 1 | 1 | 10 | 12 | ⊚ | ○ |
| Example 10 | Coating solution B | Both surfaces | 3.6 | 40 | 0 | 0 | 10 | 10 | ⊚ | ○ |
| Example 11 | Coating solution A | Both surfaces | 8.0 | 40 | 1 | 1 | 10 | 12 | ⊚ | ○ |
| Example 12 | Coating solution A | Both surfaces | 1.6 | 40 | 1 | 1 | 10 | 12 | ○ | ○ |
| Example 18 | Coating solution N | Both surfaces | 4.5 | 40 | 3 | 5 | 4 | 12 | ⊚ | ○ |
| Example 19 | Coating solution L | Both surfaces | 6.0 | 65 | 1 | 1 | 1 | 3 | ○ | ○ |
| Example 20 | Coating solution M | Both surfaces | 6.0 | 15 | 5 | 16 | 4 | 25 | ○ | ○ |
| Comparative example 1 | Coating solution G | Both surfaces | 3.0 | 10 | 1 | 1 | 18 | 20 | x | ○ |
| Comparative example 2 | Coating solution H | Both surfaces | 3.0 | 60 | 1 | 1 | 0 | 2 | x | x |
| Comparative example 3 | Coating solution A | One surface | 3.0 | 40 | 1 | 1 | 10 | 12 | x | ○ |

TABLE 2

| | Adhesion of resin layer | | | | | |
|---|---|---|---|---|---|---|
| | | After solution treatment | | | | After wet heat treatment |
| | Normal | Toluene | Ethyl acetate | Methyl ethyl ketone | Chloroform | |
| Example 18 | ○ | ○ | ○ | ○ | ○ | ○ |

The flame-retardant polyester film is a film having excellent flame retardancy. The flame-retardant polyester film is suitable for use as electrical insulating materials, and furthermore, as magnetic recording materials, capacitor materials, packaging materials, building materials, and various industrial materials. The adhesive tapes, the flexible printed circuits, the membrane switches, the film heaters, and the flat cables have excellent flame retardancy and, furthermore, excellent workability.

What is claimed is:

1. A flame-retardant polyester film comprising resin layers laminated on both surfaces of a polyester film, wherein each of the resin layers satisfies the following Formula (1) and has non-flammable gas generating rate of 3 to 40 percent over the range of 180° C. to 450° C.:

$$15 \leq (Wc_1 - Wc_2)/Wc_0 \times 100 \leq 99 \quad (1)$$

where $Wc_0$ represents the weight of the resin layer at 25° C. in air, $Wc_1$ represents the weight of the resin layer after the temperature thereof is raised from 25° C. to 600° C. in air, and $Wc_2$ represents the weight of each of the resin layers after the temperature thereof is raised from 25° C. to 800° C. in air; and each of the resin layers comprises polyimide and 30 to 65 percent by weight aluminum hydroxide based on weight of the resin layer; and wherein 70 to 100 percent of the total structural units of the polyimide are structural units represented by the following Formula (III);

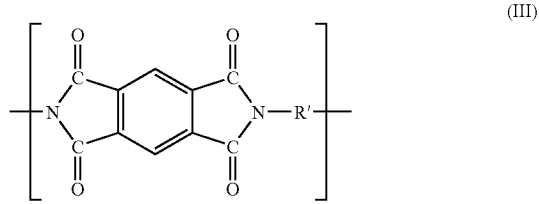

(III)

in Formula (III), R' represents at least one group selected from groups represented by the following Formula (IV);

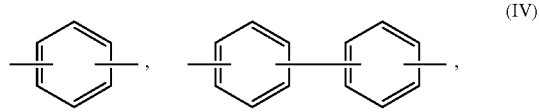

(IV)

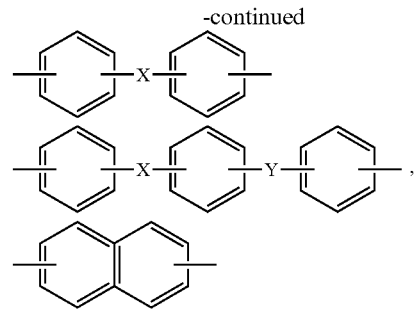

-continued in Formula (IV), Y represents at least one group selected from the groups represented by the following Formula (V);

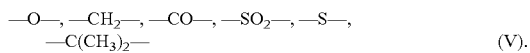

(V).

2. The flame-retardant polyester film according to 1, wherein the ratio of thickness of each of the resin layers to that of the entire polyester film is within the range of 0.5 to 30 percent.

3. The flame-retardant polyester film according to claim 1, further comprising a primer layer including an oxazoline-containing compound laminated between the polyester film and each of the resin layers.

4. Adhesive tapes comprising the flame-retardant polyester film according to claim 1.

5. Flexible printed circuits comprising the flame-retardant polyester film according to claim 1.

6. A membrane switch comprising the flame-retardant polyester film according to claim 1.

7. A film heater comprising the flame-retardant polyester film according to claim 1.

8. A flat cable comprising the flame-retardant polyester film according to claim 1.

9. The flame-retardant polyester film according to claim 1, wherein content of the aluminum hydroxide based on the weight of the resin layer is 30 to 60 percent by weight.

* * * * *

UNITED STATES PATENT AND TRADEMARK OFFICE
CERTIFICATE OF CORRECTION

PATENT NO. : 7,459,217 B2  Page 1 of 1
APPLICATION NO. : 10/755954
DATED : December 2, 2008
INVENTOR(S) : Tanaka et al.

It is certified that error appears in the above-identified patent and that said Letters Patent is hereby corrected as shown below:

In Column 2
At line 25, please change "W $_0$" to --Wc$_0$--; and at line 43, please change "Wc2" to --Wc$_2$--.
In Column 3
At line 14, please delete "of the present invention"; at line 17 please delete "in the present invention"; at line 22, please change "rate." to --rate:--; and at line 65, please delete "in the present invention";
In Column 4
At line 19, please change "of250° C" to --of 250° C--; at line 61, please delete "used in the present invention"; and at line 67, please change "the present invention" to --this disclosure--.
In Column 11
At line 13, please delete "in the present invention".
In Column 12
At line 37, please change "earned" to --carried--.
In Column 15
At line 52 and 53, please delete "of the present invention".
In Column 16
At line 67, please change ""Wc$_0$" to --Wc$_0$--.
In Column 18
At line 35, please change "$\leqq$" to --<--.
In Column 22
At line 10, please change " Θ). " to -- Θ. --.

Signed and Sealed this

Twelfth Day of May, 2009

JOHN DOLL
*Acting Director of the United States Patent and Trademark Office*